United States Patent
Wong et al.

(10) Patent No.: US 10,263,610 B2
(45) Date of Patent: Apr. 16, 2019

(54) CONTROL METHOD AND CONTROL CIRCUIT FOR SWITCH CIRCUIT AND SWITCH CIRCUIT DEVICE

(71) Applicant: JOULWATT TECHNOLOGY (HANGZHOU) CO., LTD., Hangzhou (CN)

(72) Inventors: Pitleong Wong, Hangzhou (CN); Siopang Chan, Hangzhou (CN); Feng Xu, Hangzhou (CN); Yuancheng Ren, Hangzhou (CN); Xunwei Zhou, Hangzhou (CN)

(73) Assignee: JOULWATT TECHNOLOGY (HANGZHOU) CO., LTD., Hangzhou (CN)

(*) Notice: Subject to any disclaimer, the term of this patent is extended or adjusted under 35 U.S.C. 154(b) by 0 days.

(21) Appl. No.: 15/691,716

(22) Filed: Aug. 30, 2017

(65) Prior Publication Data
US 2018/0062632 A1    Mar. 1, 2018

(30) Foreign Application Priority Data
Aug. 31, 2016  (CN) .......................... 2016 1 0784970

(51) Int. Cl.
| H03K 17/04 | (2006.01) |
| H03K 5/26 | (2006.01) |
| H03K 19/20 | (2006.01) |
| H03K 17/14 | (2006.01) |

(52) U.S. Cl.
CPC ............ *H03K 17/04* (2013.01); *H03K 5/26* (2013.01); *H03K 19/20* (2013.01); *H03K 17/14* (2013.01)

(58) Field of Classification Search
CPC ...................................................... H03K 17/04
See application file for complete search history.

(56) References Cited

U.S. PATENT DOCUMENTS 9,577,529 B2* 2/2017 Stanzione ............. H02M 3/158
9,929,651 B2* 3/2018 Cannankurichi ..... H02M 3/158

* cited by examiner

*Primary Examiner* — Jeffrey S Zweizig
(74) *Attorney, Agent, or Firm* — Perkins Coie LLP

(57) ABSTRACT

The present invention provides a control method and a control circuit for a switch circuit and a corresponding switch circuit device. The control circuit comprises: an acquiring module, configured to acquire first time; a comparing module, connected with the acquiring module and configured to compare first time with first fixed time; and an adjusting module, connected with the comparing module. The adjusting module adjusts a cycle of a turn-on signal of a first switch transistor to second fixed time when the first time is less than the first fixed time. The adjusting module adjusts the sum of second time and the first fixed time to the second fixed time to achieve spread spectrum when the first time is more than the first fixed time. The control circuit for the switch circuit provided by the present invention is used for controlling the switch circuit for spread spectrum.

3 Claims, 9 Drawing Sheets

CONTROL METHOD AND CONTROL CIRCUIT FOR SWITCH CIRCUIT AND SWITCH CIRCUIT DEVICE

CROSS-REFERENCE TO RELATED APPLICATIONS

This Non-provisional application claims priority under 35 U.S.C. § 119(a) on Patent Application No(s). 201610784970.4 filed in People's Republic of China on Aug. 31, 2016, the entire contents of which are hereby incorporated by reference.

BACKGROUND OF THE INVENTION

Field of the Invention

The present invention relates to the field of circuit technologies, and more particularly, to a control method and control circuit for a switch circuit and a switch circuit device.

Description of the Related Art

At present, a switch circuit (for example, a BUCK circuit) is a circuit commonly used in circuit design. As shown in FIG. 1A, the BUCK circuit generally includes a first switch transistor 1', a second switch transistor 2', and an inductor 3'. The first switch transistor 1' may be a Metal Oxide Semiconductor Field Effect Transistor (MOS transistor), the second switch transistor 2' may be a freewheeling diode or may be a synchronous rectifier, the Vin' is an input signal of the BUCK circuit, the Vout' is an output signal of the BUCK circuit, and the TON' is a turn-on signal of the first switch transistor 1'.

Another conventional switch circuit (for example, a BUCK circuit) is a circuit commonly used in circuit design. As shown in FIG. 1B, the BUCK circuit generally includes a first switch transistor 1, a second switch transistor 2, and an inductor 3. The first switch transistor 1 may be a Metal Oxide Semiconductor Field Effect Transistor (MOS transistor), and the second switch transistor 2' may be a Metal Oxide Semiconductor Field Effect Transistor (MOS transistor) or may be a synchronous rectifier, the Vin is an input signal of the BUCK circuit, the Vout is an output signal of the BUCK circuit, and the TON is a turn-on signal of the first switch transistor 1, and the BON is a turn-on signal of the second switch transistor 2.

Specifically, when a load of the switch circuit is larger, the switch circuit is in a continuous conduction mode (CCM). At this moment, a switching cycle of the first switch transistor 1' may be fixed time T' by setting a timing circuit, thereby achieving a constant frequency of the switch circuit. In this case, the waveform of the turn-on signal TON' of the first switch transistor 1', the waveform of a turn-on signal BON' of the second switch transistor 2', and the waveform of an inductor current I' are as shown in FIG. 2. The cycle of the turn-on signal TON' of the first switch transistor 1' is the above-mentioned fixed time T'. When the load of the switch circuit is changed from a large value to a small value, the switch circuit is gradually switched from the CCM to a discontinuous conduction mode (DCM). At this moment, the waveform of the turn-on signal TON' of the first switch transistor 1', the waveform of the turn-on signal BON' of the second switch transistor 2', and the waveform of the inductor current I' are as shown in FIG. 3. The cycle of the turn-on signal TON' of the first switch transistor 1' remains unchanged, still being the fixed time T', whereas the conduction time of the first switch transistor 1' becomes shorter. Specifically, when the switch circuit operates in the DCM, within a duty cycle, the inductor current I' rises to the maximum inductor current value within the conduction time (namely, when the TON' in FIG. 3 is at a high level) of the first switch transistor 1', drops to 0A within the conduction time (namely, when the BON' in FIG. 3 is at a high level) of the second switch transistor 2', maintains 0A until the conduction of the first switch transistor 1' in a next duty cycle, and then repeats the waveform of the previous duty cycle.

However, the inventors of this application found that after the switch circuit is switched from the CCM to the DCM, a load current is reduced as the load decreases, and the conduction time of the first switch transistor 1' may be shortened. As can be known from the above-mentioned operating process of the switch circuit, the cycle of the turn-on signal TON' of the first switch transistor 1', when the switch circuit is in the DCM, is the same as that of the turn-on signal TON' of the first switch transistor 1' when the switch circuit is in the CCM. That is, in the above two operating modes of the switch circuit, the switching cycle of the first switch transistor 1' remains unchanged. Therefore, when the constant frequency of the switch circuit is achieved by setting the timing circuit, after the conduction time of the first switch transistor 1' is shortened to be permissible minimum conduction time of the first switch transistor 1', a duty ratio of the turn-on signal TON' of the first switch transistor 1' cannot be further decreased because the duty ratio of the turn-on signal TON' of the first switch transistor 1' is obtained by dividing the conduction time of the first switch transistor 1' by the switching cycle of the first switch transistor 1', so that the load current of the switch circuit cannot be further reduced as the load decreases.

BRIEF SUMMARY OF THE INVENTION

An objective of the present invention is to provide a control method and a control circuit for a switch circuit and a switch circuit device to ensure that the switch circuit operates in a discontinuous conduction mode (DCM) and does not start spread spectrum until the DCM enters a certain depth, thereby preventing the switch circuit from starting spread spectrum in a continuous conduction mode (CCM).

To achieve the above objective, the control circuit for the switch circuit provided by the present invention adopts the following solution.

A control circuit for a switch circuit, which is applied to the switch circuit in a discontinuous conduction mode, is provided. The switch circuit includes a first switch transistor and a second switch transistor. The control circuit includes: an acquiring module, configured to acquire first time, wherein the first time is time between a falling edge of a turn-on signal of the second switch transistor in a current duty cycle and a rising edge of a turn-on signal of the first switch transistor in a next adjacent duty cycle; a comparing module, connected with the acquiring module and configured to compare the first time with first fixed time; and an adjusting module, connected with the comparing module. When the first time is less than the first fixed time, the adjusting module adjusts a cycle of the turn-on signal of the first switch transistor to second fixed time; and when the first time is more than the first fixed time, the adjusting module adjusts the sum of second time and the first fixed time to the second fixed time to achieve spread spectrum, wherein the second time is time between a rising edge of the turn-on signal of the first switch transistor and a falling edge of the turn-on signal of the second switch transistor in the same duty cycle.

Optionally, the acquiring module may include an OR gate, a transistor, a first capacitor, and a first current source. A first input terminal of the OR gate may receive the turn-on signal of the first switch transistor, a second input terminal of the OR gate may receive the turn-on signal of the second switch transistor, and an output terminal of the OR gate may be connected with a control terminal of the transistor. A first terminal of the transistor may be grounded, and a node which may be connected with a second terminal of the transistor may be a first node. The first node may further be connected with the first current source and a first plate of the first capacitor, respectively. A second plate of the first capacitor may be grounded.

Optionally, the comparing module may include a first potential comparator. A first input terminal of the first potential comparator may be connected with the first node, a potential of a second input terminal of the first potential comparator may be a first reference potential, and an output terminal of the first potential comparator may be connected with the adjusting module. The first reference potential may be a potential at the first node upon termination of the first time when the first time may be equal to the first fixed time.

Optionally, the adjusting module may include an edge comparator, a first timing unit which may be configured to time the second fixed time, and a conduction time adjusting unit which may be configured to adjust the cycle of the turn-on signal of the first switch transistor. A first input terminal of the edge comparator may be connected with the output terminal of the first potential comparator. A second input terminal of the edge comparator may be connected with an output terminal of the first timing unit. A third input terminal of the edge comparator may receive the turn-on signal of the first switch transistor. Both a first output terminal and a second output terminal of the edge comparator may be connected with the conduction time adjusting unit.

Optionally, the first timing unit may include a first switch, a second capacitor, a second current source, and a second potential comparator. A control terminal of the first switch may receive the turn-on signal of the first switch transistor, a first terminal of the first switch may be grounded, and a node that may be connected with a second terminal of the first switch may be a second node. The second node may further be connected with a first plate of the second capacitor, the second current source, and a first input terminal of the second potential comparator, respectively. A second plate of the second capacitor may be grounded. A potential of the second input terminal of the second potential comparator may be a second reference potential. An output terminal of the second potential comparator may be connected with the first input terminal of the edge comparator. The second reference potential may be a potential at the second node upon termination of a duty cycle of the switch circuit when a switching cycle of the first switch transistor may be equal to the second fixed time.

Optionally, the conduction time adjusting unit may include a second switch, a third current source, a third switch, a fourth current source, a third capacitor, and a voltage-to-current converter. A control terminal of the second switch may be connected with the first output terminal of the edge comparator. A first terminal of the second switch may be connected with the third current source. A node that may be connected with a second terminal of the second switch transistor may be a third node. The third node may further be connected with a first terminal of the third switch, a first plate of the third capacitor, and an input terminal of the voltage-to-current converter, respectively. A control terminal of the third switch may be connected with the second output terminal of the edge comparator, a second terminal of the third switch may be connected with a first terminal of the fourth current source, and a second terminal of the fourth current source may be connected with a second plate of the third capacitor. An output terminal of the voltage-to-current converter may receive a control signal of the turn-on signal of the first switch transistor.

Optionally, the second fixed time may be a switching cycle of the first switch transistor when the switch circuit is in a continuous conduction mode.

The present invention further provides a switch circuit device of the control circuit.

Furthermore, the present invention further provides a control method for the switch circuit, which is applied to the switch circuit in a discontinuous conduction mode. The switch circuit includes a first switch transistor and a second switch transistor. The control method includes: acquiring first time, wherein the first time is time between a falling edge of a turn-on signal of the second switch transistor in a current duty cycle and a rising edge of a turn-on signal of the first switch transistor in a next adjacent duty cycle; comparing the first time with first fixed time; adjusting a cycle of the turn-on signal of the first switch transistor to second fixed time when the first time is less than the first fixed time; and adjusting the sum of second time and the first fixed time to the second fixed time to achieve spread spectrum when the first time is more than the first fixed time, wherein the second time is time between a rising edge of the turn-on signal of the first switch transistor and a falling edge of the turn-on signal of the second switch transistor in the same duty cycle.

Optionally, the step of adjusting a cycle of the turn-on signal of the first switch transistor to second fixed time when the first time may be less than the first fixed time may specifically include: adjusting the cycle of the turn-on signal of the first switch transistor to the second fixed time by adjusting the conduction time of the first switch transistor when the first time is less than the first fixed time.

Optionally, the step of adjusting the sum of second time and the first fixed time to the second fixed time to achieve the spread spectrum when the first time is more than the first fixed time may specifically include: adjusting the sum of the second time and the first fixed time to the second fixed time to achieve the spread spectrum by adjusting the conduction time of the first switch transistor when the first time is more than the first fixed time.

Compared with the prior art, beneficial effects of the present invention are as below.

The control circuit for the switch circuit provided by the present invention has the above modules. Therefore, the first time can be first acquired by the acquiring module, and then the first time is compared with the first fixed time by the comparing module. The cycle of the turn-on signal of the first switch transistor is adjusted to the second fixed time by the adjusting module when the first time is less than the first fixed time. The sum of the second time and the first fixed time is adjusted to the second fixed time by the adjusting module to achieve the spread spectrum when the first time is more than the first fixed time. Therefore, by reasonably setting the first fixed time and the second fixed time, the control circuit provided by the present invention can accurately determine a numerical value of the second time in the process of spreading spectrum of the switch circuit. That is, the time between the rising edge of the turn-on signal of the first switch transistor and the falling edge of the turn-on signal of the second switch transistor in the same duty cycle can be accurately determined. In this way, it is ensured that the switch circuit operates in the DCM and does not start spreading the spectrum until the DCM enters a certain depth, thereby preventing the switch circuit from starting the spread spectrum in the CCM.

REFERENCE NUMBERS IN THE ACCOMPANYING DRAWINGS

1—acquiring module;
2—comparing module;
3—adjusting module;
31—edge comparator;
32—first timing unit;
33—conduction time adjusting unit; and
331—voltage-to-current converter.

DETAILED DESCRIPTION OF THE INVENTION

With reference to the accompanying drawings, the foregoing and additional technical features and advantages of the present invention are described clearly and completely below. Obviously, the described embodiments are only a part of the embodiments of the present invention and not all embodiments.

Embodiment One

To solve the technical problems in the prior art, this embodiment of the present invention provides a method for performing spread spectrum of a turn-on signal of a first switch transistor. That is, a duty ratio of the turn-on signal of the first switch transistor is reduced by properly extending a cycle of the turn-on signal of the first switch transistor, so that a load current of the switch circuit can be further reduced as the load decreases.

Figure 1A:
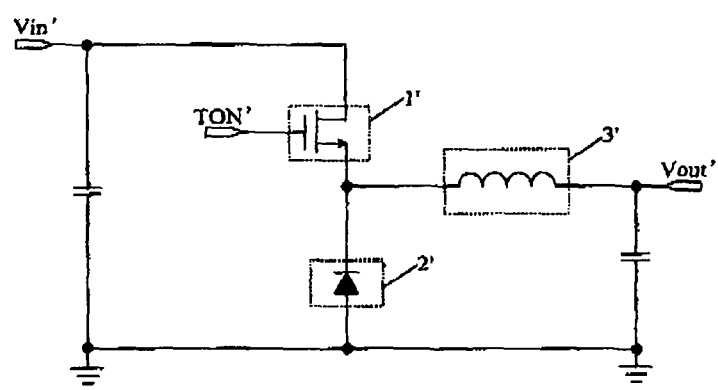
FIG. 1A is a circuit diagram of a BUCK circuit in the prior art.
Figure 1B:
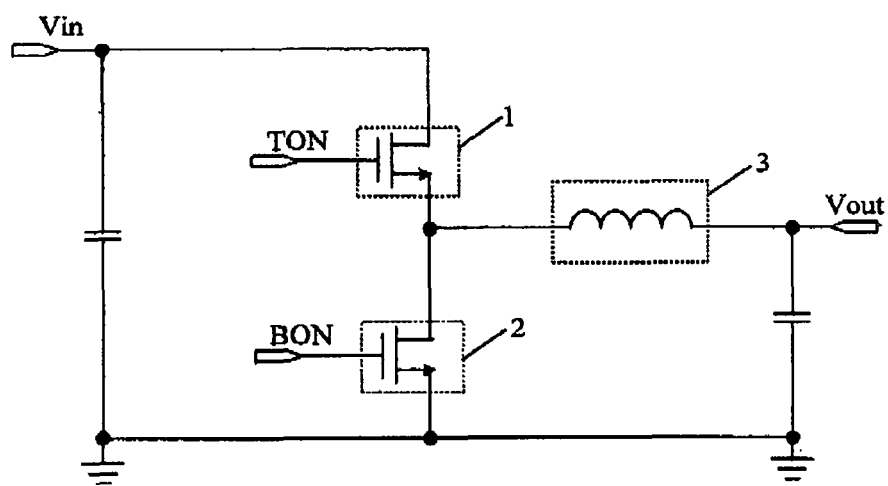
FIG. 1B is a circuit diagram of another BUCK circuit in the prior art.
Figure 2:
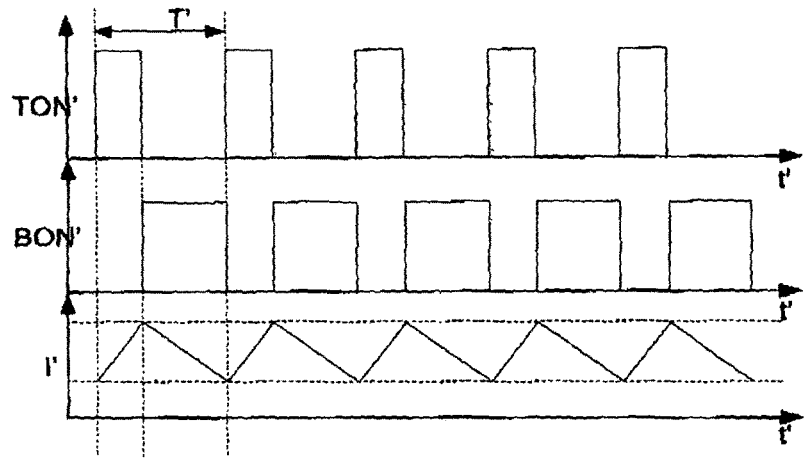
FIG. 2 is an operating timing diagram when a switch circuit in the prior art operates in a continuous conduction mode (CCM)
Figure 3:
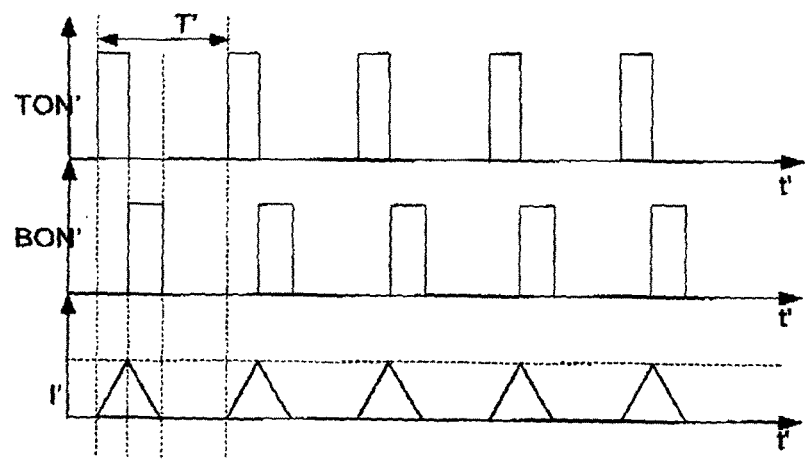
FIG. 3 is an operating timing diagram when the switch circuit in the prior art operates in a discontinuous conduction mode (DCM)
Figure 4:
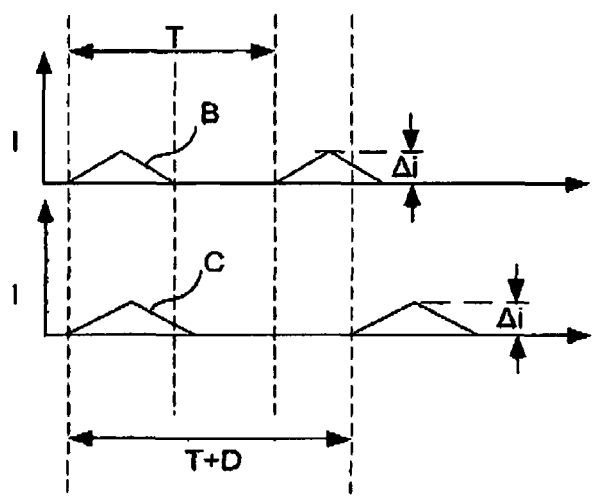
FIG. 4 is a waveform diagram of an inductor current of a switch circuit before and after spread spectrum according to an embodiment of the present invention.

Specifically, as shown in FIG. 4, when an inductor current ripple is $\Delta i$, a waveform of an inductor current I before spreading a spectrum of the turn-on signal of the first switch transistor is B, and the cycle of the turn-on signal of the first switch transistor is T; and the waveform of the inductor current I after spreading the spectrum of the turn-on signal of the first switch transistor is C, and time extended for the cycle of the turn-on signal of the first switch transistor is D. It is to be noted that the inductor current ripple $\Delta i$ is a difference between the maximum value and the minimum value of the inductor current within one duty cycle of the switch circuit.

However, the inventors of this application found that the above technical solution for performing the spread spectrum of the turn-on signal of the first switch transistor is that the spread spectrum is not started unless the inductor current ripple is smaller than a particular value. Therefore, under different application conditions (for example, inductances are different, or input voltages are different, or output voltages are different), according to the above technical solution, the switch circuit may be caused to start spreading spectrum in a continuous conduction mode (CCM), which may result in relatively low working efficiency of the switch circuit.

Figure 5:
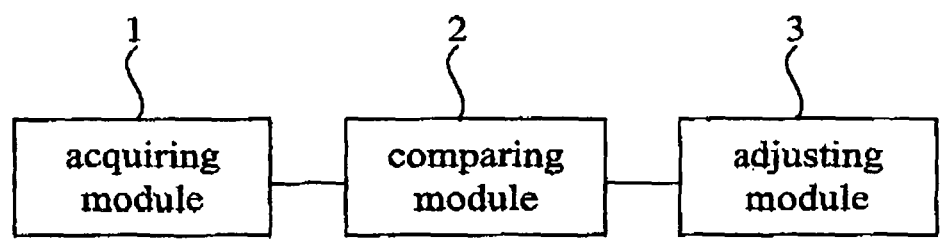
FIG. 5 is a schematic diagram of modules in a control circuit for a switch circuit according to an embodiment of the present invention.

To solve the above problem, this embodiment of the present invention further provides a switch circuit device, which includes a switch circuit and a control circuit. The control circuit is applied to the switch circuit in a discontinuous conduction mode. The switch circuit includes a first switch transistor and a second switch transistor. As shown in FIG. 5, the control circuit includes: an acquiring module 1, configured to acquire first time, the first time being time between a falling edge of a turn-on signal of the second switch transistor in a current duty cycle and a rising edge of a turn-on signal of the first switch transistor in a next adjacent duty cycle; a comparing module 2 connected with the acquiring module 1 and configured to compare the first time with first fixed time; and an adjusting module 3 connected with the comparing module 2. When the first time is less than the first fixed time, the adjusting module 3 adjusts a cycle of the turn-on signal of the first switch transistor to second fixed time; and when the first time is longer than the first fixed time, the adjusting module 3 adjusts the sum of second time and the first fixed time to the second fixed time to achieve spread spectrum, wherein the second time is the time between a rising edge of the turn-on signal of the first switch transistor and a falling edge of the turn-on signal of the second switch transistor in the same duty cycle.

Preferably, the second fixed time is the switching cycle of the first switch transistor when the switch circuit is in the continuous conduction mode, so that the switching cycle of the first switch transistor may not jump when the switch circuit is switched from the continuous conduction mode to the discontinuous conduction mode. In this way, a seamless transition is achieved when the switch circuit is switched from the continuous conduction mode to the discontinuous conduction mode.

The control circuit for the switch circuit provided by the embodiment of the present invention has the above modules. Therefore, the first time can be first acquired by the acquiring module 1, and then the first time is compared with the first fixed time by the comparing module 2. When the first time is less than the first fixed time, the cycle of the turn-on signal of the first switch transistor is adjusted to the second fixed time by the adjusting module 3. When the first time is more than the first fixed time, the sum of the second time and the first fixed time is adjusted to the second fixed time by the adjusting module 3 to achieve the spread spectrum. Therefore, by reasonably setting the first fixed time and the second fixed time, the control circuit provided by the embodiment of the present invention can accurately determine a numerical value of the second time in the process of spreading the spectrum of the switch circuit. That is, the time between the rising edge of the turn-on signal of the first switch transistor and the falling edge of the turn-on signal of the second switch transistor in the same duty cycle can be accurately determined. In this way, it can be ensured that the switch circuit operates in the DCM and does not start spreading the spectrum until the DCM enters a certain depth, thereby preventing the switch circuit from starting the spread spectrum in the CCM.

The specific circuit structures of the above acquiring module 1, the comparing module 2, and the adjusting module 3 are described hereinbelow.

Figure 6:
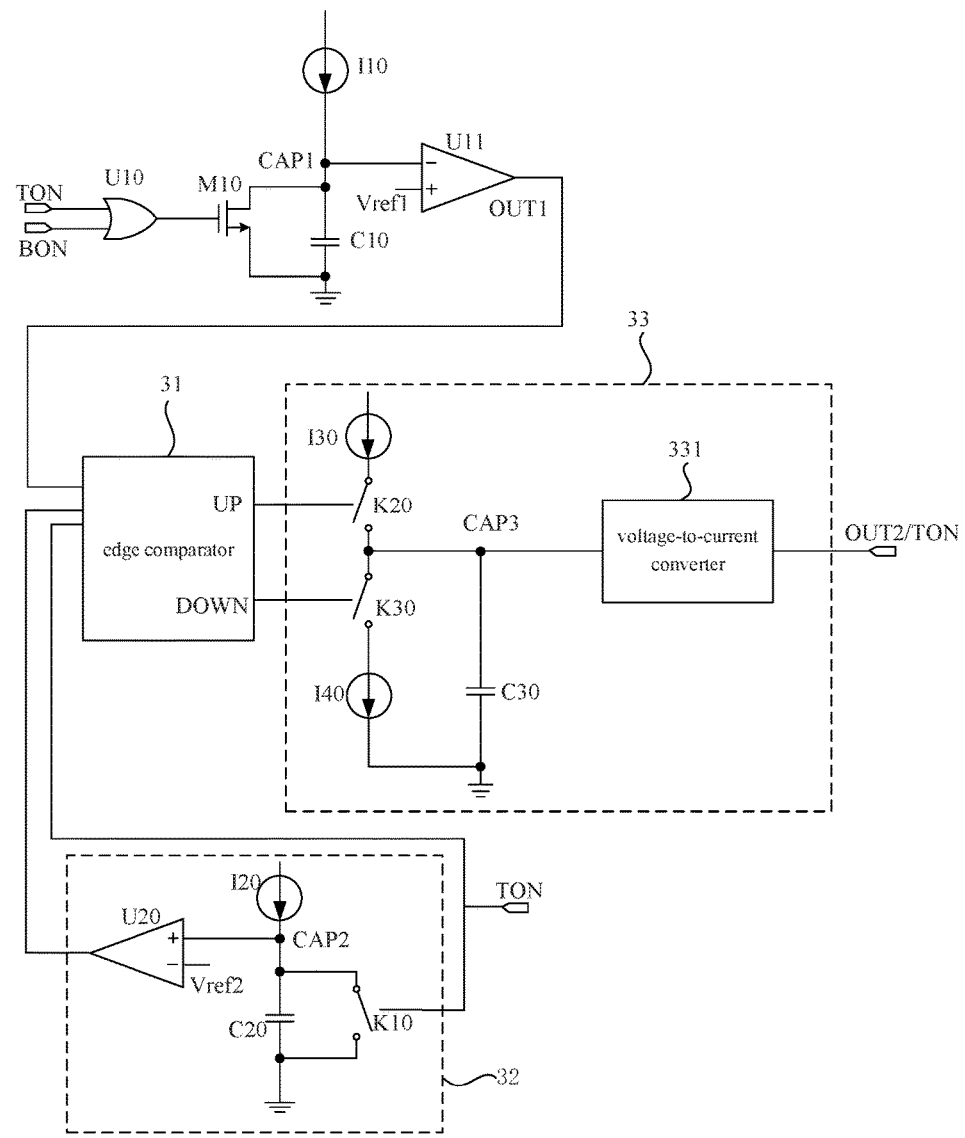
FIG. 6 is a circuit diagram of a control circuit for a switch circuit according to an embodiment of the present invention.

Specifically, as shown in FIG. 6, the acquiring module 1 includes an OR gate U10, a transistor M10, a first capacitor C10, and a first current source I10. A first input terminal of the OR gate U10 receives the turn-on signal TON of the first switch transistor, a second input terminal of the OR gate U10 receives the turn-on signal BON of the second switch transistor, and an output terminal of the OR gate U10 is connected with a control terminal of the transistor M10. A first terminal of the transistor M10 is grounded, and a node connected with a second terminal of the transistor M10 is a first node CAP1. The first node CAP1 is further connected with the first current source I10 and a first plate of the first capacitor C10, respectively, and a second plate of the first capacitor C10 is grounded.

When the turn-on signal TON of the first switch transistor is at a high level or the turn-on signal BON of the second switch transistor is at a high level, namely when the first switch transistor or the second switch transistor is switched on, the OR gate U10 outputs a high level. At this moment, the transistor M10 is switched on, and the first plate of the first capacitor C10 is grounded through the transistor M10. When the turn-on signal BON of the second switch transistor is reduced from a high level to a low level, namely when the second switch transistor is switched off, the OR gate U10 outputs a low level. At this moment, the transistor M10 is switched off, the first plate of the capacitor is disconnected from the ground, and the first current source I10 charges the capacitor, thereby causing the potential of the first plate of the capacitor to rise. When the rising edge of the turn-on signal TON of the first switch transistor in the next cycle reappears, namely when the first switch transistor is switched on again, the OR gate U10 outputs a high level. At this moment, the transistor M10 is switched on again, and then the working process of the previous cycle is repeated. Furthermore, as can be known from the foregoing contents, the first time is the time between the falling edge of the turn-on signal BON of the second switch transistor in the current duty cycle and the rising edge of the turn-on signal TON of the first switch transistor in the next adjacent duty cycle, and the second time is the time between the rising edge of the turn-on signal TON of the first switch transistor and the falling edge of the turn-on signal BON of the second switch transistor in the same duty cycle. Therefore, the working process of the acquiring module 1 having the above circuit structure may be summarized as follows: within the second time, the first plate of the capacitor is connected to the ground all the time; and when the first time begins, the first current source I10 starts charging the first plate of the capacitor, and when the first time ends, the first current source I10 ends up charging the first plate of the capacitor.

Figure 9:
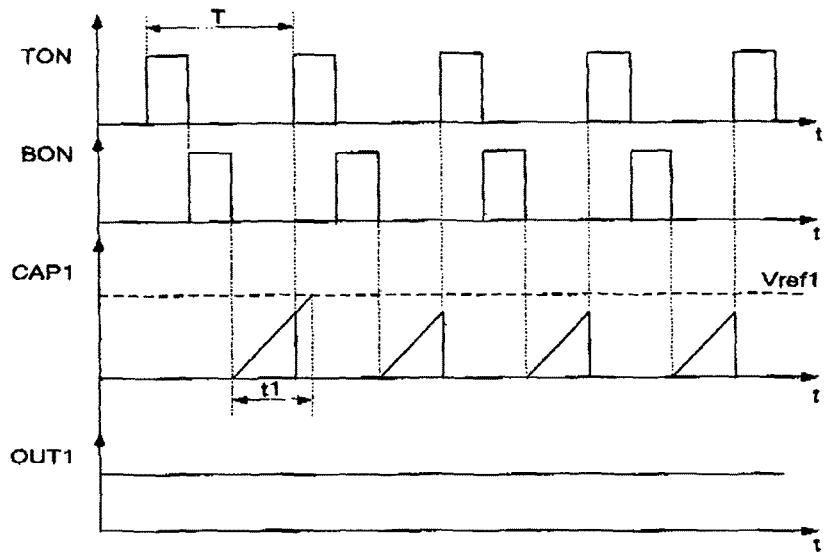
FIG. 9 is a third operating timing diagram of a control circuit for a switch circuit according to an embodiment of the present invention.
Figure 10:
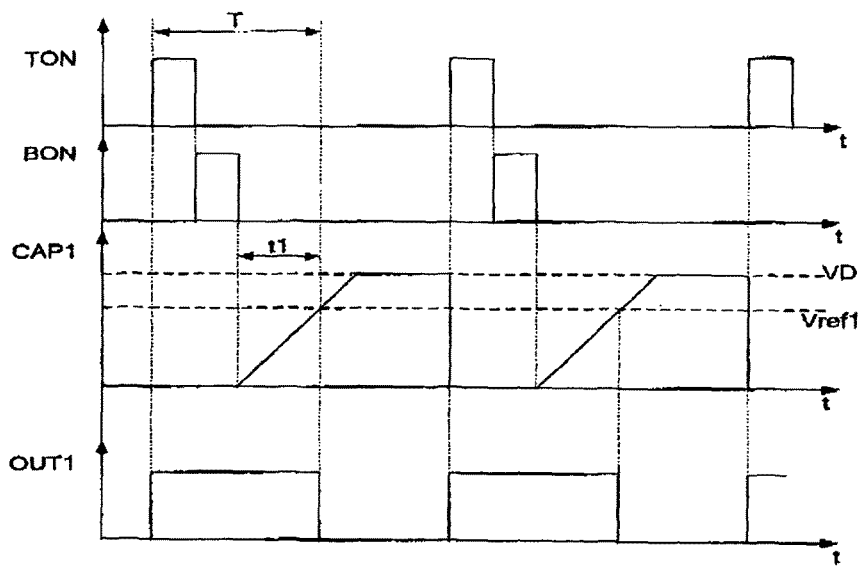
FIG. 10 is a fourth operating timing diagram of a control circuit for a switch circuit according to an embodiment of the present invention.

Further, as shown in FIG. 6, the comparing module 2 includes a first potential comparator U11. A first input terminal of the first potential comparator U11 is connected with the first node CAP1, a potential of a second input terminal of the first potential comparator U11 is a first reference potential $V_{ref1}$, and an output terminal of the first potential comparator U11 is connected with the adjusting module 3. The first reference potential $V_{ref1}$ is a potential at the first node CAP1 upon termination of the first time when the first time is equal to the first fixed time t1. Therefore, when the first time is less than the first fixed time t1, as shown in FIG. 9, the potential of the first plate of the capacitor (namely, the potential at the first node CAP1) upon termination of the first time is smaller than the first reference potential $V_{ref1}$, an output signal OUT1 of the first potential comparator U11 is at a high level all the time, namely, the falling edge does not appear in the output signal OUT1 of the first potential comparator U11. When the first time is more than the first fixed time t1, as shown in FIG. 10, the potential of the first plate of the capacitor upon termination of the first time is larger than the first reference potential $V_{ref1}$, the output signal OUT1 of the first potential comparator U11 may be reduced from a high level to a low level, namely, the falling edge may appear in the output signal OUT1 of the first potential comparator U11, wherein the VD is the potential of the first current source I10. As can be known from the above analysis, the first time can be compared with the first fixed time t1 by determining whether the falling edge appears in the output signal OUT1 of the first potential comparator U11. Furthermore, it is to be noted that the abscissa of each of the above signal waveform is time t.

Further, as shown in FIG. 6, the adjusting module 3 includes an edge comparator 31, a first timing unit 32 configured to time the second fixed time T, and a conduction time adjusting unit 33 configured to adjust the cycle of the turn-on signal TON of the first switch transistor. A first input terminal of the edge comparator 31 is connected with the output terminal of the first potential comparator U11, a second input terminal of the edge comparator 31 is connected with an output terminal of the first timing unit 32, a third input terminal of the edge comparator 31 is connected with the turn-on signal TON of the first switch transistor, and both a first output terminal UP and a second output terminal DOWN of the edge comparator 31 are connected with the conduction time adjusting unit 33.

Specifically, as shown in FIG. 6, the first timing unit 32 includes a first switch K10, a second capacitor C20, a second current source I20, and a second potential comparator U20. A control terminal of the first switch K10 is connected with the turn-on signal TON of the first switch transistor, a first terminal of the first switch transistor K10 is grounded, and a node connected with a second terminal of the first switch transistor K10 is a second node CAP2. The second node CAP2 is further connected with a first plate of the second capacitor C20, the second current source I20, and a first input terminal of the second potential comparator I20, respectively. A second plate of the second capacitor C20 is grounded. A potential of the second input terminal of the second potential comparator U20 is a second reference potential $V_{ref2}$, and an output terminal of the second potential comparator U20 is connected with the first input terminal of the edge comparator 31. The second reference potential $V_{ref2}$ is a potential at the second node CAP2 upon termination of a duty cycle of the switch circuit when a switching cycle of the first switch transistor is equal to the second fixed time T.

When the rising edge of the turn-on signal TON of the first switch transistor appears, the first switch K10 is switched on for certain time, wherein the time is much shorter than the conduction time of the first switch transistor, for example, 30 nanoseconds. At this moment, the first plate of the second capacitor C20 is connected to the ground through the first switch K10, thereby resetting to 0V. Next, the first switch K10 is switched off, the first plate of the second capacitor C20 is disconnected from the ground, and the second current source I20 starts to charge the first plate of the second capacitor C20. When the rising edge of the turn-on signal TON of the first switch transistor in the next cycle appears, the first switch K10 is switched on again for certain time. At this moment, the second current source I20 ends up charging the first plate of the second capacitor C20 within a cycle, then the first switch K10 is switched off again, and the working process of the previous cycle is repeated. As can be known from the charging process of the first plate of the second capacitor C20, when the switching cycle of the first switch transistor is shorter than the second fixed time T, the potential of the first plate of the second capacitor C20 at the end of charging in one cycle is smaller than the second reference potential $V_{ref2}$. At this moment, the output signal of the second potential comparator U20 is always at a low level. That is, the rising edge does not appear in the output signal of the second potential comparator U20. When the switching cycle of the first switch transistor is more than the second fixed time T, the potential of the first plate of the second capacitor C20 at the end of charging in one cycle is greater than the second reference potential $V_{ref2}$. At this moment, the output signal of the second potential comparator U20 may rise from a low level to a high level. That is, the rising edge may appear in the output signal of the second potential comparator U20.

Furthermore, as shown in FIG. 6, the conduction time adjusting unit 33 includes a second switch K20, a third current source I30, a third switch K30, a fourth current source I40, a third capacitor C30, and a voltage-to-current converter 331. A control terminal of the second switch K20 is connected with the first output terminal UP of the edge comparator 31, a first terminal of the second switch K20 is connected with the third current source I30, and a node connected with a second terminal of the second switch K20 is a third node CAP3. The third node CAP3 is further connected with a first terminal of the third switch K30, a first plate of the third capacitor C30, and an input terminal of the voltage-to-current converter 331, respectively. A control terminal of the third switch K30 is connected with the second output terminal DOWN of the edge comparator 31, a second terminal of the third switch K30 is connected with a first terminal of the fourth current source I40, and a second terminal of the fourth current source I40 is connected with a second plate of the third capacitor C30. An output terminal of the voltage-to-current converter 331 outputs the turn-on signal TON of the first switch transistor.

The first timing unit 32 starts timing at the rising edge of the turn-on signal TON of the first switch transistor. The output of the second potential comparator U20 of the first timing unit 32 flips when the first timing unit 32 times to the second fixed time T. If neither the falling edge of the first potential comparator U11 nor the rising edge of the turn-on signal TON of the first switch transistor in the next cycle appears, the second output terminal DOWN of the edge comparator 31 switches the third switch K30 off, and the first output terminal UP of the edge comparator 31 makes the second switch K20 switched on for a period of time and then switches the second switch K20 off, so that charges of the third capacitor C30 are increased and the voltage at the third node CAP3 is increased. The voltage-to-current converter 331 converts the voltage at the third node CAP3 into an output current OUT2 of the voltage-to-current converter 331 according to a certain proportion. Therefore, the output current OUT2 becomes larger, and the conduction time of the first switch transistor is reduced, so that the switching cycle of the first switch transistor is reduced, and the switching frequency is increased. When the first timing unit 32 does not time to the second fixed time T, and if the falling edge of the first potential comparator U11 or the turn-on signal of the first switch transistor in the next cycle appears, the first output terminal UP of the edge comparator 31 switches the second switch K20 off, and the second output terminal DOWN of the edge comparator 31 makes the third switch K30 switched on for a period of time and then switches the third switch K30 off, so that charges of the third capacitor C30 are partly released and the voltage at the third node CAP3 is decreased. The voltage-to-current converter 331 converts the voltage at the third node CAP3 into output current OUT2 according to a certain proportion. If the output current OUT2 is reduced, the conduction time of the first switch transistor is increased, so that the switching frequency is decreased.

Figure 7:
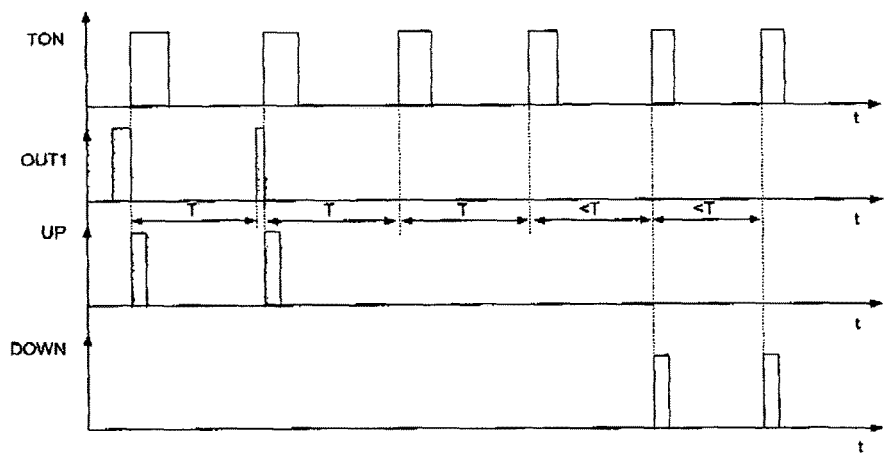
FIG. 7 is a first operating timing diagram of a control circuit for a switch circuit according to an embodiment of the present invention.

When the first time is less than the first fixed time t1, as shown in FIG. 7, if the switching cycle of the first switch transistor is more than the second fixed time T, the first output terminal UP of the edge comparator 31 controls the second switch K20 to be switched on for a period of time and then switches the second switch K20 off. The second output terminal DOWN of the edge comparator 31 controls the third switch K30 to be in an off state all the time. Within the conduction time of the second switch K20, the third current source I30 charges the first plate of the third capacitor C30, so that the potential at the third node CAP3 rises. The increased potential at the third node CAP3 is converted into the output current OUT2 by the voltage-to-current converter 331 according to a certain proportion, so that the control signal of the turn-on signal TON of the first switch transistor is adjusted, the switching cycle of the first switch transistor is shortened, and thus the switching cycle of the first switch transistor is equal or close to the second fixed time T. If the switching cycle of the first switch transistor is less than the second fixed time T, the second output terminal DOWN of the edge comparator 31 controls the third switch K30 to be switched on for a period of time and then switches the third switch K30 off. The first output terminal UP of the edge comparator 31 controls the second switch transistor K20 to be in an off state all the time. Within the conduction time of the third switch K30, the charges of the first plate of the third capacitor C30 are partly released so that the potential at the third node CAP3 is decreased. The voltage-to-current converter 331 converts the decreased potential at the third node CAP3 into output current OUT2 according to a certain proportion, so that the control signal of the turn-on signal TON of the first switch transistor is adjusted, the switching cycle of the first switch transistor is extended, and thus the switching cycle of the first switch transistor is equal or close to the second fixed time T.

Figure 8:
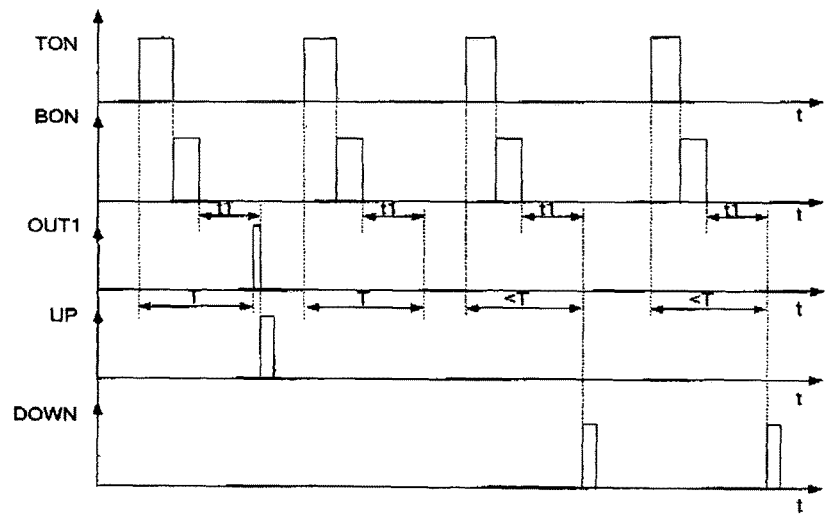
FIG. 8 is a second operating timing diagram of a control circuit for a switch circuit according to an embodiment of the present invention.

Similarly, when the first time is more than the first fixed time t1, as shown in FIG. 8, if the sum of the second time and the first fixed time t1 is greater than the second fixed time T, the potential at the third node CAP3 rises, so that the output current OUT2 of the voltage-to-current converter 331 is increased, and thus the sum of the second time and the first fixed time t1 is equal or close to the second fixed time T. If the sum of the second time and the first fixed time t1 is less than the second fixed time T, the potential at the third node CAP3 drops, so that the output current OUT2 of the voltage-to-current converter 331 is decreased, and thus the sum of the second time and the first fixed time t1 is equal or close to the second fixed time T. Reference can be made to the operating process when the first time is less than the first fixed time t1 for the above specific operating process, which is not described any more herein for a concise reason.

Embodiment Two

Figure 11:
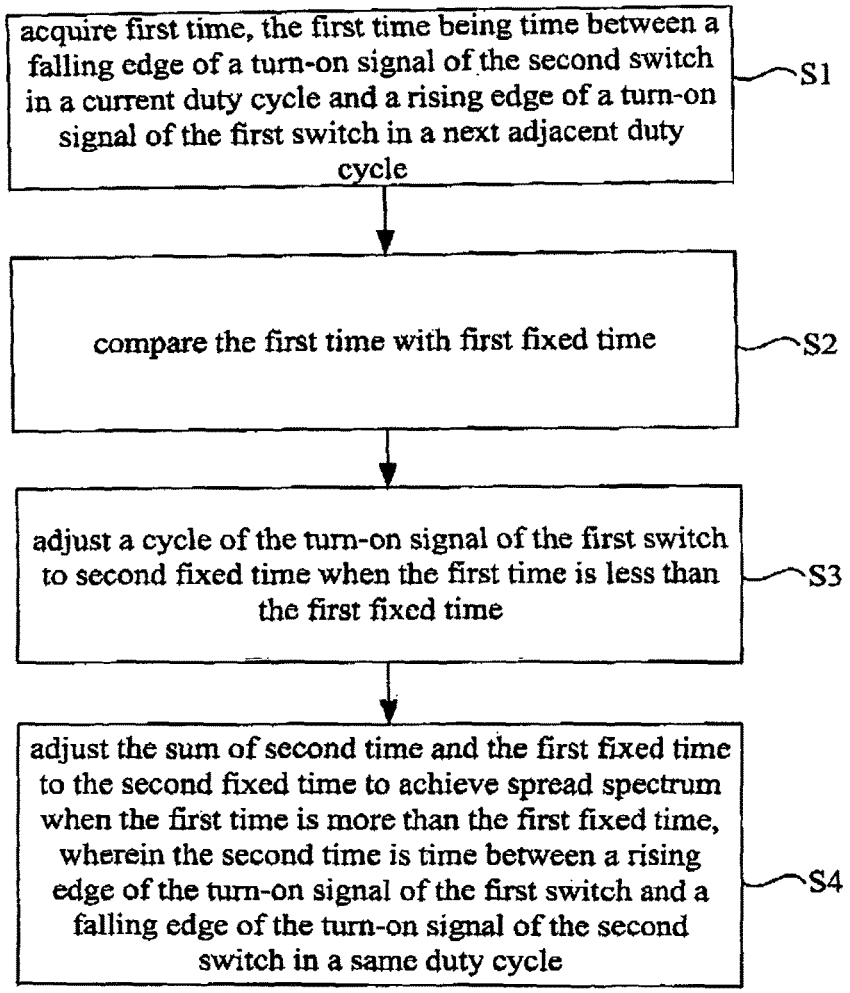
FIG. 11 is a flow chart of a control method for a switch circuit according to an embodiment of the present invention.

This embodiment of the present invention provides a control method for a switch circuit. The control method is applied to the switch circuit in a discontinuous conduction mode. The switch circuit includes a first switch transistor and a second switch transistor. As shown in FIG. 11, the control method includes following steps: S1: acquiring first time, wherein the first time is time between a falling edge of a turn-on signal of the second switch transistor in a current duty cycle and a rising edge of a turn-on signal of the first switch transistor in a next adjacent duty cycle; S2: comparing the first time with first fixed time; S3: adjusting a cycle of the turn-on signal of the first switch transistor to second fixed time when the first time is less than the first fixed time; and S4: adjusting the sum of second time and the first fixed time to the second fixed time to achieve spread spectrum when the first time is more than the first fixed time, wherein the second time is time between a rising edge of the turn-on signal of the first switch transistor and a falling edge of the turn-on signal of the second switch transistor in a same duty cycle.

The control method for the switch circuit provided by the above embodiment of the present invention has the above steps. Therefore, the first time can be first acquired, and then the first time is compared with the first fixed time. The cycle of the turn-on signal of the first switch transistor is adjusted to the second fixed time when the first time is less than the first fixed time. The sum of second time and the first fixed time is adjusted to the second fixed time to achieve spread spectrum when the first time is more than the first fixed time. Therefore, by reasonably setting the first fixed time and the second fixed time, the control method provided by this embodiment of the present invention can accurately determine a numerical value of the second time in the process of spreading spectrum of the switch circuit. That is, the time between the rising edge of the turn-on signal of the first switch transistor and the falling edge of the turn-on signal of the second switch transistor in the same duty cycle can be accurately determined. In this way, it can be ensured that the switch circuit operates in the DCM and does not start spreading the spectrum until the DCM enters a certain depth, thereby preventing the switch circuit from starting the spread spectrum in the CCM.

Specifically, the Step S3 of adjusting the cycle of the turn-on signal of the first switch transistor to the second fixed time when the first time is less than the first fixed time may specifically include: adjusting the cycle of the turn-on signal of the first switch transistor to the second fixed time by adjusting the conduction time of the first switch transistor when the first time is less than the first fixed time. Furthermore, the cycle of the turn-on signal of the first switch transistor can be adjusted to the second fixed time by adjusting the switch-off time of the first switch transistor; or the cycle of the turn-on signal of the first switch transistor may be adjusted to the second fixed time by adjusting an inductor current ripple.

Specifically, the S4 of adjusting the sum of the second time and the first fixed time to the second fixed time to achieve the spread spectrum when the first time is more than the first fixed time may specifically include: adjusting the sum of the second time and the first fixed time to the second fixed time to achieve the spread spectrum by adjusting the conduction time of the first switch transistor when the first time is more than the first fixed time. Furthermore, the sum of the second time and the first fixed time may be adjusted to the second fixed time by adjusting the switch-off time of the first switch transistor; or the sum of the second time and the first fixed time may be adjusted to the second fixed time by adjusting the inductor current ripple.

In the above specific embodiments, the objectives, the technical solutions and the beneficial effects of the present invention are further described in detail. However, it should be understood that the above embodiments are merely specific embodiments of the present invention and are not intended to limit the scope of protection of the present invention. It is particularly pointed out that for those skilled in the art, all modifications, equivalent substitutions and improvements made within the spirit and principle of the present invention shall fall within the scope of protection of the present invention.

What is claimed is:

1. A control method for a switch circuit, applied to the switch circuit in a discontinuous conduction mode, wherein the switch circuit forms a buck converter, and the switch circuit comprises a first switch transistor and a second switch transistor, wherein the control method comprises:
   acquiring a first time, the first time being time between a falling edge of a turn-on signal of the second switch transistor in a current duty cycle and a rising edge of a turn-on signal of the first switch transistor in a next adjacent duty cycle;
   comparing the first time with a first fixed time;
   adjusting a cycle of the turn-on signal of the first switch transistor to a second fixed time when the first time is less than the first fixed time; and
   adjusting the sum of a second time and the first fixed time to the second fixed time to achieve spread spectrum when the first time is more than the first fixed time, wherein the second time is time between a rising edge of the turn-on signal of the first switch transistor and a falling edge of the turn-on signal of the second switch transistor in a same duty cycle.

2. The control method for the switch circuit according to claim 1, wherein the step of adjusting the cycle of the turn-on signal of the first switch transistor to the second fixed time when the first time is less than the first fixed time specifically comprises:
   adjusting the cycle of the turn-on signal of the first switch transistor to the second fixed time by adjusting conduction time of the first switch transistor when the first time is less than the first fixed time.

3. The control method for the switch circuit according to claim 1, wherein the step of adjusting the sum of the second time and the first fixed time to the second fixed time to achieve the spread spectrum when the first time is more than the first fixed time specifically comprises:

adjusting the sum of the second time and the first fixed time to the second fixed time to achieve the spread spectrum by adjusting conduction time of the first switch transistor when the first time is more than the first fixed time.

* * * * *